United States Patent
Jeon

(10) Patent No.: US 11,762,023 B2
(45) Date of Patent: Sep. 19, 2023

(54) BATTERY DIAGNOSING SYSTEM AND METHOD

(71) Applicant: LG ENERGY SOLUTION, LTD., Seoul (KR)

(72) Inventor: Young-Hwan Jeon, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 55 days.

(21) Appl. No.: 17/442,071

(22) PCT Filed: Sep. 29, 2020

(86) PCT No.: PCT/KR2020/013391
§ 371 (c)(1),
(2) Date: Sep. 22, 2021

(87) PCT Pub. No.: WO2021/066555
PCT Pub. Date: Apr. 8, 2021

(65) Prior Publication Data
US 2022/0170988 A1     Jun. 2, 2022

(30) Foreign Application Priority Data

Oct. 4, 2019   (KR) ........................ 10-2019-0123392

(51) Int. Cl.
*G01R 31/367* (2019.01)
*G01R 31/392* (2019.01)
*H01M 10/42* (2006.01)

(52) U.S. Cl.
CPC ......... *G01R 31/367* (2019.01); *G01R 31/392* (2019.01); *H01M 10/4285* (2013.01)

(58) Field of Classification Search
CPC ............... G01R 31/367; G01R 31/392; H01M 10/4285
See application file for complete search history.

(56) References Cited

U.S. PATENT DOCUMENTS

| 2005/0164694 A1 | 7/2005 | Kim |
| 2012/0025769 A1* | 2/2012 | Kikuchi .................. B60L 58/14 320/118 |

(Continued)

FOREIGN PATENT DOCUMENTS

| CN | 101782628 A | 7/2010 |
| CN | 103311585 A | 9/2013 |

(Continued)

OTHER PUBLICATIONS

International Search Report issued in corresponding International Patent Application No. PCT/KR2020/013391, dated Jan. 25, 2021.

(Continued)

*Primary Examiner* — Raymond L Nimox
(74) *Attorney, Agent, or Firm* — Morgan, Lewis & Bockius LLP

(57) ABSTRACT

The present disclosure is directed to providing a battery diagnosing system and method, which updates a diagnosis table of a battery diagnosing apparatus by communication between a central server and the battery diagnosing apparatus, and stores battery state information and a diagnosis code as a backup. According to an aspect of the present disclosure, since the diagnosis table stored in the battery diagnosing apparatus may be updated to a latest state, the battery state may be diagnosed more accurately. In addition, according to an aspect of the present disclosure, since the central server determines whether the diagnosis code generated by the battery diagnosing apparatus is misdiagnosed, the battery state may be diagnosed more accurately and reliably.

10 Claims, 5 Drawing Sheets

(56) References Cited

U.S. PATENT DOCUMENTS

| | | | |
|---|---|---|---|
| 2014/0065971 A1* | 3/2014 | Nonaka | H04B 17/00 |
| | | | 455/41.2 |
| 2015/0234015 A1* | 8/2015 | Park | G01R 31/396 |
| | | | 702/63 |
| 2015/0350750 A1 | 12/2015 | Yun et al. | |
| 2016/0241058 A1 | 8/2016 | Carralero et al. | |
| 2017/0017482 A1 | 1/2017 | Yabe et al. | |
| 2018/0217208 A1* | 8/2018 | Park | H01M 10/48 |
| 2019/0089019 A1* | 3/2019 | Lee | G01R 31/371 |
| 2019/0109471 A1 | 4/2019 | Lee et al. | |
| 2019/0135128 A1* | 5/2019 | Kim | H01M 10/441 |
| 2019/0195942 A1* | 6/2019 | Cheon | G01R 31/2829 |
| 2020/0099216 A1 | 3/2020 | Chen et al. | |

FOREIGN PATENT DOCUMENTS

| | | |
|---|---|---|
| CN | 105137362 A | 12/2015 |
| CN | 108469812 A | 8/2018 |
| CN | 109070755 A | 12/2018 |
| CN | 109541987 A | 3/2019 |
| CN | 109716579 A | 5/2019 |
| JP | 2011-075458 A | 4/2011 |
| JP | 2011-184167 A | 9/2011 |
| JP | 2015-001439 A | 1/2015 |
| JP | 6157744 B2 | 7/2017 |
| KR | 10-0606052 B1 | 7/2006 |
| KR | 10-1468314 B1 | 12/2014 |
| KR | 10-2015-0129460 A | 11/2015 |
| KR | 10-2018-0097344 A | 8/2018 |
| KR | 20180097344 A * | 8/2018 |
| KR | 10-2019-0050637 A | 5/2019 |
| WO | 2019-184862 A1 | 10/2019 |
| WO | WO-2019184862 A1 * | 10/2019 |

OTHER PUBLICATIONS

Extended European Search Report dated Apr. 7, 2022 issued by the European Patent Office in a corresponding European Patent Application No. 20871714.0.

Office Action dated Jul. 19, 2023, issued in corresponding Chinese Patent Application No. 202080032031.9.

Fu Xing-feng et al., "Design and study of diagnostic services function of drive battery management system," Chinese Journal of Power Soruces, vol. 12, 2014, pp. 2245-2247 (with English Abstract).

* cited by examiner

FIG. 3

| DIAGNOSIS CONDITION | DIAGNOSIS CODE | DIAGNOSIS STATE |
| --- | --- | --- |
| $V < 0.1[v]$ | G | BATTERY FAILURE STATE |
| $0.1[v] \leq V < 1[v]$ | B | BATTERY DANGER STATE |
| $1[v] \leq V < 1.5[v]$ | A | BATTERY WARNING STATE |
| $1.5[v] \leq V \leq 4.5[v]$ | S | BATTERY NORMAL STATE |
| $4.5[v] < V \leq 4.75[v]$ | A | BATTERY WARNING STATE |
| $4.75[v] < V \leq 4.9[v]$ | B | BATTERY DANGER STATE |
| $4.9[v] < V$ | G | BATTERY FAILURE STATE |

FIG. 4

| DIAGNOSIS CONDITION | DIAGNOSIS CODE | DIAGNOSIS STATE |
| --- | --- | --- |
| $V < 0.1[v]$ | G | BATTERY FAILURE STATE |
| $0.1[v] \leq V < 1[v]$ | B | BATTERY DANGER STATE |
| $1[v] \leq V < 1.3[v]$ | A | BATTERY WARNING STATE |
| $1.3[v] \leq V \leq 4.597[v]$ | S | BATTERY NORMAL STATE |
| $4.597[v] < V \leq 4.758[v]$ | A | BATTERY WARNING STATE |
| $4.758[v] < V \leq 4.9[v]$ | B | BATTERY DANGER STATE |
| $4.9[v] < V$ | G | BATTERY FAILURE STATE |

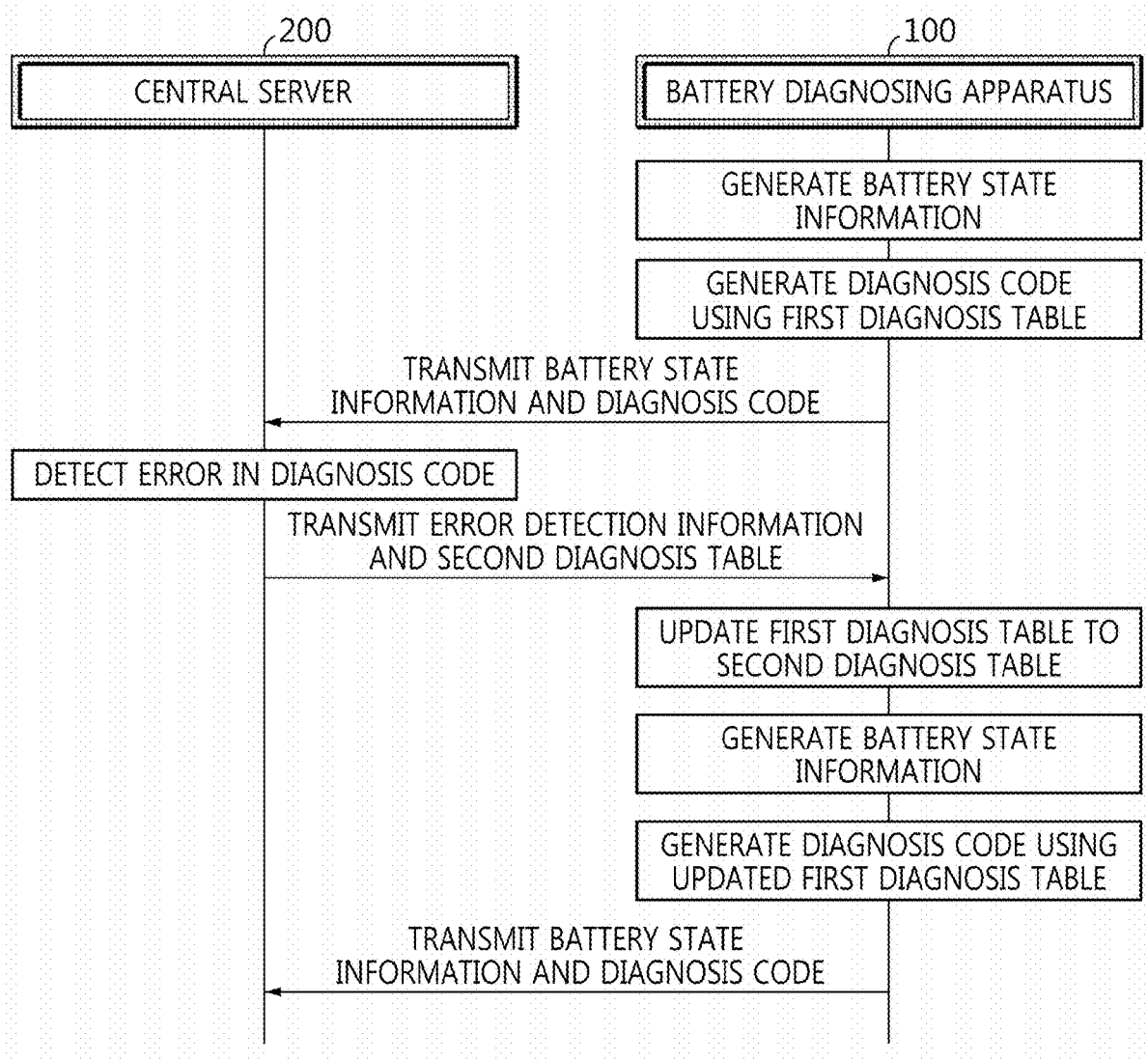
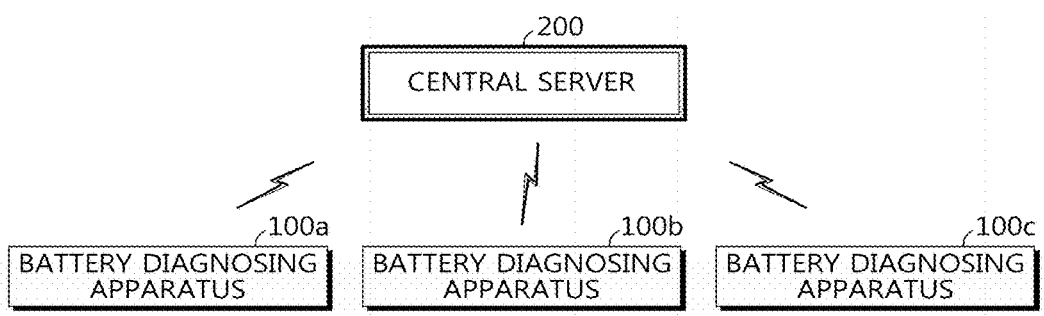

BATTERY DIAGNOSING SYSTEM AND METHOD

TECHNICAL FIELD

The present application claims priority to Korean Patent Application No. 10-2019-0123392 filed on Oct. 4, 2019 in the Republic of Korea, the disclosures of which are incorporated herein by reference.

The present disclosure relates to a battery diagnosing system and method, and more particularly, to a battery diagnosing system and method for diagnosing battery state information.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

The state information of the battery may be diagnosed through a diagnosis code called DTC (Diagnostic Trouble Code). However, since the DTC itself is only a value for a fault phenomenon, it is difficult for a general user to figure out a fault state and related measures by checking the DTC.

As a related art, Patent Literature 1 discloses an intelligent battery sensor for a vehicle, which is capable of identifying the cause of a failure of a battery through a generated DTC, and a data storage method using the same. However, Patent Literature 1 uses only an internal memory (volatile and nonvolatile) to identify the cause of a failure according to internal variables of IBS (Intelligent Battery Sensor) immediately before DTC generation.

That is, the memory of Patent Literature 1 cannot be updated to be customized to the battery or the environment around the vehicle, and the generated DTC is stored only in the memory inside the vehicle. Thus, there is a fatal problem that it is impossible to check the history of the generated DTC if the memory is damaged due to vehicle damage or the like.

(Patent Literature 1) KR 10-2015-0129460 A

DISCLOSURE

Technical Problem

The present disclosure is designed to solve the problems of the related art, and therefore the present disclosure is directed to providing a battery diagnosing system and method, which updates a diagnosis table of a battery diagnosing apparatus by communication between a central server and the battery diagnosing apparatus, and stores battery state information and a diagnosis code as a backup.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery diagnosing system for diagnosing a state of a battery module having at least one battery cell, the battery diagnosing system comprising: a battery diagnosing apparatus configured to generate battery state information based on at least one of temperature, voltage and current of the battery module, generate a diagnosis code corresponding to the battery state information by using a pre-stored first diagnosis table, and transmit at least one of the battery state information and the diagnosis code; and a central server configured to receive at least one of the battery state information and the diagnosis code from the battery diagnosing apparatus, determine whether the received diagnosis code is misdiagnosed by using a stored second diagnosis table and the received battery state information, and transmit a misdiagnosis determination result and the second diagnosis table to the battery diagnosing apparatus when the diagnosis code is determined as being misdiagnosed.

The battery diagnosing apparatus may be configured to update the pre-stored first diagnosis table to the second diagnosis table when the misdiagnosis determination result and the second diagnosis table are received from the central server.

The central server may be configured to determine whether the received diagnosis code is misdiagnosed by comparing a result obtained by putting the battery state information into the second diagnosis table with the received diagnosis code.

The battery diagnosing apparatus may be configured to store the second diagnosis table received from the central server in an area different from the area in which the first diagnosis table is stored, and change the first diagnosis table to the second diagnosis table when the second diagnosis table is completely stored.

The battery diagnosing apparatus may be configured to store the first diagnosis table in an area indicated by a first reference address, and change the first reference address and a second reference address with each other when the second diagnosis table is stored in an area indicated by the second reference address.

The central server may be connected to a plurality of battery diagnosing apparatuses and configured to transmit the misdiagnosis determination result and the second diagnosis table to a battery diagnosing apparatus that has transmitted the misdiagnosed diagnosis code among the plurality of battery diagnosing apparatuses.

When the second diagnosis table is updated, the central server may be configured to transmit the updated second diagnosis table to all of the plurality of battery diagnosing apparatuses, based on an updated content or a predetermined cycle.

The central server may be configured to store the battery state information and the diagnosis code received from each of the plurality of battery diagnosing apparatuses and store an update history of the stored first diagnosis table in each of the plurality of battery diagnosing apparatuses.

The central server may be configured to calculate a deviation of the battery state information for each battery cell included in the battery module based on the battery state information, diagnose a state of the battery module based on the calculated deviation, and transmit the diagnosis result to the battery diagnosing apparatus.

The battery diagnosing apparatus may be configured to receive the diagnosis result and perform balancing to each battery cell included in the battery module according to the received diagnosis result.

A battery diagnosing method according to another embodiment of the present disclosure may comprise: a battery state information generating step of, by a battery diagnosing apparatus, generating battery state information based on at least one of temperature, voltage and current of a battery module; a diagnosis code generating step of, by the battery diagnosing apparatus, generating a diagnosis code corresponding to the battery state information by using a pre-stored first diagnosis table; an information receiving step of, by a central server, receiving at least one of the battery state information and the diagnosis code from the battery diagnosing apparatus; a misdiagnosis determining step of, by the central server, determining whether the received diagnosis code is misdiagnosed by using a stored second diagnosis table and the received battery state information; a misdiagnosis determination result transmitting step of, by the central server, transmitting a misdiagnosis determination result and the second diagnosis table to the battery diagnosing apparatus when the diagnosis code is determined as being misdiagnosed; and a diagnosis table updating step of, by the battery diagnosing apparatus, updating the pre-stored first diagnosis table to the second diagnosis table when the misdiagnosis determination result and the second diagnosis table are received from the central server.

Advantageous Effects

According to an aspect of the present disclosure, since the diagnosis table stored in the battery diagnosing apparatus may be updated to a latest state, the battery state may be diagnosed more accurately.

In addition, according to an aspect of the present disclosure, since the central server determines whether the diagnosis code generated by the battery diagnosing apparatus is misdiagnosed, the battery state may be diagnosed more accurately and reliably.

In addition, according to an aspect of the present disclosure, since the diagnosis table is updated in consideration of the surrounding situation of the battery, the battery state may be diagnosed in consideration of the surrounding situation.

In addition, according to an aspect of the present disclosure, since the battery state information and the diagnosis code are backed up in the central server, even if the battery diagnosing apparatus is damaged, it is possible to provide the battery diagnosis history.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 3 is a diagram schematically showing an example of a first diagnosis table for a voltage of a battery cell.

FIG. 4 is a diagram schematically showing an example of a second diagnosis table for the voltage of the battery cell.

FIG. 5 is a diagram schematically showing a process for the central server and the battery diagnosing apparatus to communicate as time goes, in the battery diagnosing system according to an embodiment of the present disclosure.

FIG. 6 is a diagram showing a battery diagnosing system according to another embodiment of the present disclosure.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
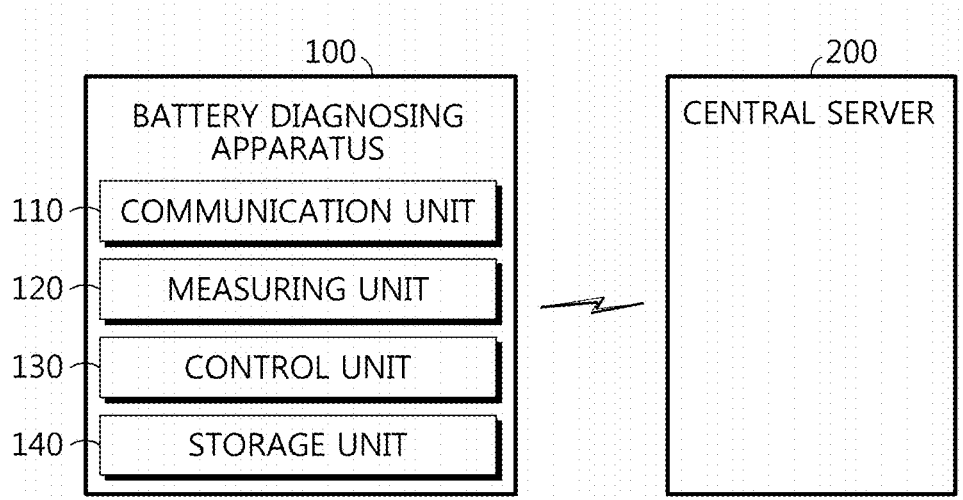
FIG. 1 is a diagram schematically showing a battery diagnosing system according to an embodiment of the present disclosure.

FIG. 1 is a diagram schematically showing a battery diagnosing system according to an embodiment of the present disclosure.

Referring to FIG. 1, a battery diagnosing system according to an embodiment of the present disclosure may include a battery diagnosing apparatus 100 and a central server 200. In addition, the battery diagnosing system may diagnose a state of a battery module 10 having at least one battery cell. Here, at least one battery cell may be connected in series and/or in parallel in the battery module 10. In addition, the battery cell refers to one independent cell that has a negative electrode terminal and a positive electrode terminal and is physically separable. For example, one pouch-type lithium polymer cell may be regarded as the battery cell.

The battery diagnosing apparatus 100 may include a communication unit 110, a measuring unit 120, a control unit 130, and a storage unit 140. A detailed exemplary configuration of the battery diagnosing apparatus 100 will be described with reference to FIG. 2.

Figure 2:
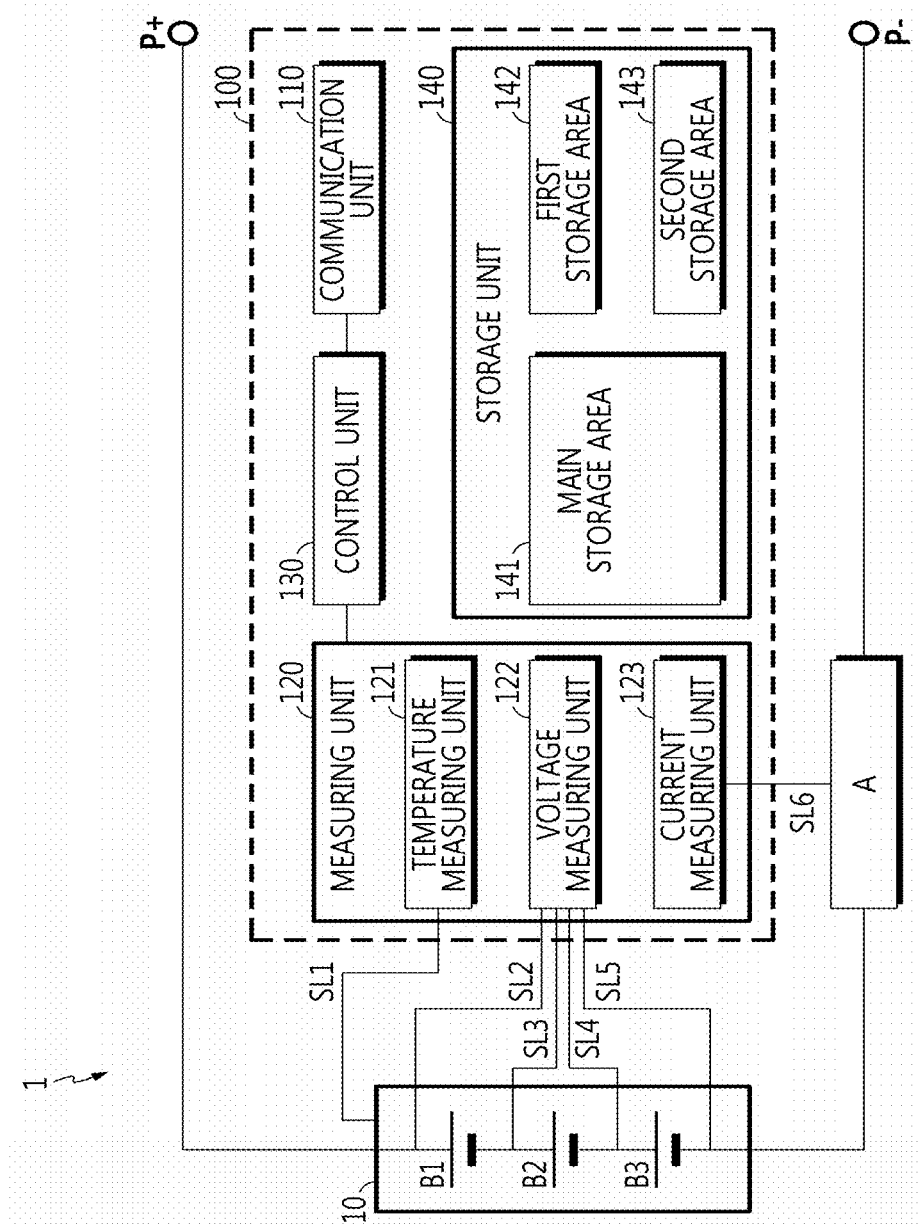
FIG. 2 is a diagram showing an exemplary configuration of a battery diagnosing apparatus, in the battery diagnosing system according to an embodiment of the present disclosure.

FIG. 2 is a diagram showing an exemplary configuration of a battery diagnosing apparatus 100, in the battery diagnosing system according to an embodiment of the present disclosure.

Referring to FIG. 2, the battery diagnosing apparatus 100 may be provided inside a battery pack 1. In addition, the battery pack 1 may include the battery module 10, and the battery module 10 may be connected to the battery diagnosing apparatus 100. Hereinafter, for convenience of description, it is assumed that the battery module 10 includes a first battery cell, a second battery cell, and a third battery cell.

For example, in the embodiment of FIG. 2, the measuring unit 120 may include a temperature measuring unit 121, a voltage measuring unit 122, and a current measuring unit 123. In addition, the temperature measuring unit 121 may measure a temperature of the battery module 10 through a first sensing line SL1 connected to the battery module 10.

The voltage measuring unit 122 may measure a voltage of each battery cell and a voltage of the battery module 10 through a plurality of connected sensing lines.

For example, in the embodiment of FIG. 2, the voltage measuring unit 122 may be connected to the battery module 10 through a second sensing line SL2, a third sensing line SL3, a fourth sensing line SL4 and a fifth sensing line SL5. Specifically, the voltage measuring unit 122 may measure a potential at both ends of the first battery cell by using the second sensing line SL2 and the third sensing line SL3, and measure a voltage of the first battery cell by obtaining a difference between the measured potentials. Similarly, the voltage measuring unit 122 may measure a voltage of the second battery cell by using the third sensing line SL3 and the fourth sensing line SL4. In addition, the voltage measuring unit 122 may measure a voltage of the third battery cell by using the fourth sensing line SL4 and the fifth sensing line SL5. In addition, the voltage measuring unit 122 may measure the voltage of the battery module 10 by using the second sensing line SL2 and the fifth sensing line SL5.

The current measuring unit 123 may measure a current flowing through a charging and discharging path of the battery module 10 through the connected sensing line. Specifically, an ampere meter A may be disposed between a negative electrode terminal of the battery module 10 and a negative electrode terminal P− of the battery pack 1. However, the position of the ampere meter A is not limited thereto, and the ampere meter A may also be disposed between a positive electrode terminal of the battery module 10 and a positive electrode terminal P+ of the battery pack 1.

In addition, the current measuring unit 123 may measure a charging and discharging current of the battery module 10 through a sixth sensing line SL6 connected to the ampere meter A.

The battery diagnosing apparatus 100 may be configured to generate battery state information based on at least one of temperature, voltage and current of the battery module 10.

Specifically, the control unit 130 included in the battery diagnosing apparatus 100 may receive temperature information, voltage information and current information of the battery module 10 measured by the measuring unit 120. In addition, the control unit 130 may generate battery state information including at least one of the temperature information, the voltage information and the current information.

In addition, the control unit 130 may estimate a SOC (State of Charge) of the battery module 10 based on the temperature information and the voltage information received from the measuring unit 120. For example, in the embodiment of FIG. 2, a main storage area 141 of the storage unit 140 may store a look-up table in which SOCs corresponding to the temperature information and the voltage information are mapped. Accordingly, the control unit 130 may generate SOC information based on the temperature information and the voltage information received from the measuring unit 120 by using the look-up table stored in the main storage area 141 of the storage unit 140.

In addition, the battery diagnosing apparatus 100 may be configured to generate a diagnosis code corresponding to the battery state information by using the pre-stored first diagnosis table. For example, in the embodiment of FIG. 2, the first diagnosis table may be stored in a first storage area 142 of the storage unit 140.

Specifically, the control unit 130 of the battery diagnosing apparatus 100 may be configured to generate the diagnosis code by putting the generated battery state information into a first diagnosis table. In addition, the generated battery state information and the generated diagnosis code may be mapped with each other and stored in the main storage area 141.

FIG. 3 is a diagram schematically showing an example of a first diagnosis table for a voltage of a battery cell. FIG. 4 is a diagram schematically showing an example of a second diagnosis table for the voltage of the battery cell. That is, FIGS. 3 and 4 show examples of the first diagnosis table and the second diagnosis table for the voltage of one battery cell.

Referring to FIGS. 2 and 3, the first diagnosis table may include a diagnosis code and a diagnosis state according to each diagnosis condition. For example, the control unit 130 of the battery diagnosing apparatus 100 may generate a diagnosis code for the state of each of the plurality of battery cells B1, B2 and B3 based on the voltages of the plurality of battery cells B1, B2 and B3. Specifically, if a diagnosis target voltage (X) of the first battery cell B1 is less than 0.1[v] or exceeds 4.9[v], the control unit 130 may generate a diagnosis code G for the first battery cell B1 that indicates a battery failure state.

The battery diagnosing apparatus 100 stores the first diagnosis table for each of temperature, voltage and current of the battery module 10, and may generate a diagnosis code for the battery module 10 by using the stored first diagnosis table. In addition, the battery diagnosing apparatus 100 may generate a diagnosis code by combining two or more of temperature, voltage and current of the battery module 10.

The battery diagnosing apparatus 100 may be configured to transmit at least one of the battery state information and the diagnosis code.

Specifically, the battery diagnosing apparatus 100 and the central server 200 may be connected to through a wireless communication channel and communicate with each other.

For example, in the embodiment of FIG. 2, the battery diagnosing apparatus 100 may include a communication unit 110 configured to enable wireless communication with the central server 200. In addition, the control unit 130 may transmit the battery state information and the diagnosis code to the central server 200 through the communication unit 110.

The central server 200 may be configured to receive at least one of the battery state information and the diagnosis code from the battery diagnosing apparatus 100.

In addition, the central server 200 may be configured to determine whether the received diagnosis code is misdiagnosed by using the stored second diagnosis table and the received battery state information.

Specifically, the second diagnosis table different from the first diagnosis table stored in the battery diagnosing apparatus 100 may be stored in the central server 200. For example, referring to FIGS. 3 and 4, the first diagnosis table stored in the battery diagnosing apparatus 100 and the second diagnosis table stored in the central server 200 may have different diagnosis conditions. The central server 200 may determine whether the diagnosis code determined by the battery diagnosing apparatus 100 according to the battery state information is accurately diagnosed by using the second diagnosis table.

For example, it is assumed that the voltage of the first battery cell B1 and the second battery cell B2 is 3.5[V], and the voltage of the third battery cell B3 is 3.0[V]. The central server 200 may generate a diagnosis code by putting the battery state information received from the battery diagnosing apparatus 100 into the second diagnosis table. Here, referring to FIG. 3, the battery diagnosing apparatus 100 may generate all of the diagnosis codes of the plurality of battery cells B1, B2 and B3 as S by using the first diagnosis table. Also, referring to FIG. 4, the central server 200 may generate all of the diagnosis codes of the plurality of battery cells B1, B2 and B3 as S by using the second diagnosis table. In addition, since the diagnosis code generated for each of the plurality of battery cells B1, B2 and B3 and the diagnosis code received from the battery diagnosing apparatus 100 are identical, the central server 200 may determine that the battery state of the battery diagnosing apparatus 100 is correctly diagnosed.

If it is determined that the diagnosis code diagnosed by the battery diagnosing apparatus 100 is misdiagnosed, the central server 200 may be configured to transmit a misdiagnosis determination result and the second diagnosis table to the battery diagnosing apparatus 100.

That is, if it is determined that the diagnosis code diagnosed by the battery diagnosing apparatus 100 according to the battery state information by using the first diagnosis table is misdiagnosed, the central server 200 may transmit the misdiagnosis determination result determined based on the second diagnosis table and the second diagnosis table to the battery diagnosing apparatus 100.

For example, the second diagnosis table may be updated by a user or according to preset conditions. That is, although the second diagnosis table identical to the first diagnosis table shown in FIG. 3 is stored in the central server 200, the diagnosis condition may be updated with the second diagnosis table shown in FIG. 4. Therefore, diagnosis codes may be determined differently by the first diagnosis table and the second diagnosis table. In this case, the central server 200 may transmit the second diagnosis table and the misdiagnosis determination result to the battery diagnosing apparatus 100. That is, the second diagnosis table stored in the central server 200 may be a table used as a criterion for determining the diagnosis code.

The battery diagnosing apparatus 100 may be configured to update the pre-stored first diagnosis table to the second diagnosis table, when receiving the misdiagnosis determination result and the second diagnosis table from the central server 200.

The battery diagnosing apparatus 100 may receive and store the misdiagnosis determination result from the central server 200 and update a diagnosis table used for generating the diagnosis code according to the battery state information from the first diagnosis table to the second diagnosis table.

After that, the battery diagnosing apparatus 100 may generate a diagnosis code of the battery module 10 by using the diagnosis table identical to the second diagnosis table of the central server 200.

According to the battery diagnosing system according to an embodiment of the present disclosure, since the central server 200 determines whether the diagnosis code diagnosed by the battery diagnosing apparatus 100 is misdiagnosed, the accuracy and reliability of the diagnosis code generated for the battery module 10 may be improved.

In addition, since the diagnosis tables used in the central server 200 and the battery diagnosing apparatus 100 are kept to be identical to each other, there is an advantage that an accurate diagnosis code may be generated for the battery module 10.

Meanwhile, the control unit 130 provided to the battery diagnosing apparatus 100 may selectively include processors known in the art, application-specific integrated circuit (ASIC), other chipsets, logic circuits, registers, communication modems, data processing devices, and the like to execute various control logic performed in the present disclosure. Also, when the control logic is implemented in software, the control unit 130 may be implemented as a set of program modules. At this time, the program module may be stored in a memory and executed by the control unit 130. The memory may be located inside or out of the control unit 130 and may be connected to the control unit 130 by various well-known means.

That is, the storage unit 140 provided to the battery diagnosing apparatus 100 may store programs, data and the like required for operating the control unit 130. That is, the storage unit 140 may store data necessary for operation and function of each component of the battery diagnosing apparatus 100, data generated in the process of performing the operation or function, or the like. The storage unit 140 is not particularly limited in its kind as long as it is a known information storage means that can record, erase, update and read data. As an example, the information storage means may include RAM, flash memory, ROM, EEPROM, registers, and the like. In addition, the storage unit 140 may store program codes in which processes executable by the control unit 130 are defined.

The central server 200 may be configured to compare a result obtained by putting the battery state information into the second diagnosis table with the received diagnosis code to determine whether the received diagnosis code is misdiagnosed.

Specifically, the central server 200 may generate a diagnosis code using the second diagnosis table by putting the battery state information received from the battery diagnosing apparatus 100 into the stored second diagnosis table. The central server 200 may determine whether the generated diagnosis code is identical to the diagnosis code received from the battery diagnosing apparatus 100.

For example, it is assumed that the diagnosis target voltage (X) in the battery state information generated by the battery diagnosing apparatus 100 is 4.55[v] Referring to FIG. 3, the diagnosis code generated by the battery diagnosing apparatus 100 using the first diagnosis table may be A. Meanwhile, referring to FIG. 4, the diagnosis code generated by the central server 200 using the second diagnosis table may be S.

In other words, since the diagnosis conditions of the first diagnosis table and the second diagnosis table are different, the battery diagnosing apparatus 100 determines that the state of the battery cell with the diagnosis target voltage (X) of 4.55[v] is as a battery warning state, but the central server 200 may determine that the state of the battery cell is a battery normal state. Therefore, the central server 200 may determine that the diagnosis code generated by the battery diagnosing apparatus 100 is misdiagnosed.

In this case, the central server 200 may transmit the misdiagnosis determination result and the second diagnosis table to the battery diagnosing apparatus 100, and the battery diagnosing apparatus 100 may receive the second diagnosis table and update the stored first diagnosis table.

Since the battery diagnosing system according to an embodiment of the present disclosure generates diagnosis codes for the battery state information twice by the battery diagnosing apparatus 100 and the central server 200 and checks whether the generated diagnosis codes are identical to each other, it is possible to improve the accuracy of battery state diagnose.

FIG. 5 is a diagram schematically showing a process for the central server 200 and the battery diagnosing apparatus 100 to communicate as time goes, in the battery diagnosing system according to an embodiment of the present disclosure.

Referring to FIG. 5, the battery diagnosing apparatus 100 may first generate battery state information. In addition, the battery diagnosing apparatus 100 may generate a diagnosis code corresponding to the generated battery state information by using the first diagnosis table.

For example, the first diagnosis table may be the same as the diagnosis table shown in FIG. 3. The battery diagnosing apparatus 100 may generate a diagnosis code for the voltage of the battery cell by putting the voltage of the battery cell in the generated battery state information into the first diagnosis table.

In addition, the battery diagnosing apparatus 100 may transmit the generated battery state information and the generated diagnosis code to the central server 200. The central server 200 may detect an error in the received diagnosis code. That is, the central server 200 may determine whether the received diagnosis code is misdiagnosed by using the second diagnosis table. For example, the central server 200 may generate a diagnosis code by putting the received battery state information into the second diagnosis table shown in FIG. 4. In addition, if the generated diagnosis code and the received diagnosis code are different from each other, the central server 200 may transmit error detection information and the second diagnosis table to the battery diagnosing apparatus 100.

Here, the error detection information may be a result of comparing the diagnosis code generated by the central server 200 with the diagnosis code generated by the battery diagnosing apparatus 100.

The battery diagnosing apparatus 100 may receive and store the error detection information from the central server 200 and update the first diagnosis table to the received second diagnosis table.

In addition, the battery diagnosing apparatus 100 may regenerate battery state information, regenerate a diagnosis code by using the updated first diagnosis table, and transmit the regenerated battery state information and the regenerated diagnosis code to the central server 200. That is, the battery diagnosing apparatus 100 may periodically upload the battery state information and the diagnosis code to the central server 200.

The battery diagnosing apparatus 100 may be configured to store the second diagnosis table received from the central server 200 in an area different from the area in which the first diagnosis table is stored.

For example, in the embodiment of FIG. 2, the first diagnosis table may be stored in the first storage area 142 of the storage unit 140. In addition, the second diagnosis table received through the communication unit 110 may be stored in a second storage area 143 of the storage unit 140.

In addition, the battery diagnosing apparatus 100 may be configured to change the first diagnosis table to the second diagnosis table, if the second diagnosis table is completely stored.

That is, the battery diagnosing apparatus 100 may generate the diagnosis code by using the first diagnosis table even while receiving the second diagnosis table from the central server 200. In addition, if the second diagnosis table is completely received, namely if the second diagnosis table is stored in the second storage area 143, the first diagnosis table may be updated to the second diagnosis table.

For example, assuming that it is simultaneously performed to receive the second diagnosis table and update the first diagnosis table, a gap may occur in generating the diagnosis code for the battery state information according to the communication environment between the battery diagnosing apparatus 100 and the central server 200.

Specifically, it is assumed that the battery diagnosing apparatus 100 is provided to a vehicle. If the vehicle is in an environment where communication with the central server 200 is not available, for example in a tunnel, or if the communication speed between the vehicle and the central server 200 is rapidly lowered, it may be delayed to receive the second diagnosis table. In this case, if the second diagnosis table is received and the first diagnosis table is updated at the same time, the accuracy of diagnosis code generation may be seriously deteriorated.

Preferably, while the first diagnosis table is being updated, the battery diagnosing apparatus 100 may be set not to generate a diagnosis code. If a diagnosis code is generated while the first diagnosis table is being updated, a gap section in which the diagnosis code is not generated may occur.

For example, while the first diagnosis table shown in FIG. 3 is updated to the second diagnosis table shown in FIG. 4, X is a voltage of the battery state information, which may be a diagnosis target voltage. In addition, it is assumed that the section in which the diagnosis condition is 1[v]≤X<1.3[v] is updated. In this case, by using the first diagnosis table being updated, the battery diagnosing apparatus 100 may generate a diagnosis code A if the voltage of the battery cell falls within the section 1[v]≤X<1.3[v], may generate a diagnosis code S if the voltage of the battery cell falls within the section 1.5[v]≤X<4.5[v]. That is, the battery diagnosing apparatus 100 has a problem in that it not possible to generate a corresponding diagnosis code if the voltage of the battery cell falls within the section 1.3[v]≤X<1.5[v].

Therefore, in order to prevent the gap in the generation of diagnosis code, the battery diagnosing apparatus 100 may receive and store the second diagnosis table in an area separate from the first diagnosis table, and then update the first diagnosis table to the second diagnosis table if the second diagnosis table is completely stored. In addition, while receiving the second diagnosis table, the battery diagnosing apparatus 100 stores the second diagnosis table in an area separate from the area in which the first diagnosis table is stored, so that diagnosis codes for the battery state information are successively generated, thereby having an advantage of diagnosing the state of the battery module 10 continuously.

The battery diagnosing apparatus 100 may be configured to store the first diagnosis table in an area indicated by a first reference address.

Here, the first reference address may be an address indicating an area in which the first diagnosis table is stored. That is, the control unit 130 of the battery diagnosing apparatus 100 may access the first reference address and read the first diagnosis table.

For example, the first reference address may be a start address of the first storage area 142 of the storage unit 140. Therefore, the control unit 130 may access the first storage area 142 by accessing the first reference address. In addition, the control unit 130 may read the first diagnosis table by accessing the first storage area 142.

Also, the battery diagnosing apparatus 100 may be configured to change the first reference address and a second reference address to each other if the second diagnosis table is stored in an area indicated by the second reference address.

For example, the area indicated by the second reference address may be a start address of the second storage area 143 of the storage unit 140. If the second diagnosis table is completely stored in the second storage area 143, the control unit 130 may change the area indicated by the first reference address to the starting address of the second storage area 143, and change the area indicated by the second reference address to the starting address of the first storage area 142.

After that, the control unit 130 may access the second storage area 143 by accessing the first reference address. In addition, the control unit 130 may read the second diagnosis table by accessing the second storage area 143. Therefore, the control unit 130 may generate a diagnosis code for the battery state information by using the second diagnosis table.

That is, after the second diagnosis table is completely stored, the battery diagnosing apparatus 100 according to an embodiment of the present disclosure may significantly reduce the changing time of the first diagnosis table and the second diagnosis table by changing the first reference address and the second reference address. Therefore, there is an advantage in that the gap in the generation of diagnosis code for the battery state information may be minimized.

FIG. 6 is a diagram showing a battery diagnosing system according to another embodiment of the present disclosure.

Referring to FIG. 6, a battery diagnosing system according to another embodiment of the present disclosure may include one central server 200 and a plurality of battery diagnosing apparatuses 100.

The central server 200 may be configured to be connected to the plurality of battery diagnosing apparatuses 100. However, hereinafter, for convenience of explanation, as shown in FIG. 6, the central server 200 will be described as being connected to a first battery diagnosing apparatus 100a, a second battery diagnosing apparatus 100b and a third battery diagnosing apparatus 100c.

Preferably, each of the plurality of battery diagnosing apparatuses 100 may be connected to the central server 200 through a wireless communication channel.

The central server 200 may be configured to transmit the misdiagnosis determination result and the second diagnosis table to the battery diagnosing apparatus 100, which has transmitted the misdiagnosed diagnosis code, among the plurality of battery diagnosing apparatuses 100. That is, the central server 200 may be configured to transmit the misdiagnosis determination result and the second diagnosis table only to the battery diagnosing apparatus 100 that has transmitted the misdiagnosis diagnosis code.

The plurality of battery diagnosing apparatuses 100 may be configured to independently receive the misdiagnosis determination result and the second diagnosis table, so that the battery module 10 connected to each of the plurality of battery diagnosing apparatuses 100 has a most optimized diagnosis table.

For example, the first battery diagnosing apparatus 100a and the second battery diagnosing apparatus 100b may store the same first diagnosis table, and the first battery diagnosing apparatus 100a and the third battery diagnosing apparatus 100c may store different first diagnosis tables.

In addition, the central server 200 may prevent a communication delay caused by an overload of a communication channel by transmitting the misdiagnosis determination result and the second diagnosis table only to the corresponding battery diagnosing apparatus 100 among the plurality of battery diagnosing apparatuses 100. Accordingly, as a result, the plurality of battery diagnosing apparatuses 100 may include the first diagnosis table in which different diagnosis conditions are set according to the state information of the connected battery module 10.

The battery diagnosing system according to another embodiment of the present disclosure has an advantage that the first diagnosis table 100 is updated only for the corresponding battery diagnosing apparatuses among the plurality of battery diagnosing apparatuses 100 in order to create an optimized communication environment between the central server 200 and the plurality of battery diagnosing apparatuses 100.

In addition, the battery diagnosing system may prevent the system space of the battery diagnosing apparatus 100 from being unnecessarily wasted by preventing the first diagnosis table from being updated unnecessarily frequently.

If the second diagnosis table is updated, the central server 200 may be configured to transmit the updated second diagnosis table to all of the plurality of battery diagnosing apparatuses 100 based on the updated content or a predetermined cycle.

Specifically, the diagnosis condition of the second diagnosis table stored in the central server 200 may be updated. For example, if the battery diagnosing apparatus 100 is provided to a vehicle, the state of the battery module 10 included in the vehicle may be affected by temperature. Therefore, the central server 200 may collect weather information from the outside and change the diagnosis condition of the second diagnosis table according to the temperature.

For example, in winter when the temperature is low, the battery module 10 may be rapidly discharged. Therefore, the central server 200 may change the diagnosis condition of a low voltage section (for example, a section less than 3[v]) of the battery module 10 in the second diagnosis table in consideration of the discharge of the battery module 10 in winter. In the embodiment of FIG. 4, X denotes the diagnosis target voltage, like the former embodiment. The central server 200 may change the diagnosis condition of the section $X<0.1[v]$ to $X<0.15[v]$ and change the diagnosis condition of the section $0.1[v] \leq X<1[v]$ to $0.15[v] \leq X<1.5[v]$. In addition, the central server 200 may change the diagnosis condition of the section $1[v] \leq X<1.3[v]$ to $1.5[v] \leq X<2[v]$ and change the of the section $1.3[v] \leq X \leq 4.597[v]$ to $2[v] \leq X \leq 4.597[v]$. As such, the central server 200 may more strictly apply the diagnosis code according to the discharge of the battery module 10 by changing the diagnosis condition in the low voltage section in consideration of the discharge of the battery module 10 according to the ambient temperature.

As another example, in summer when the temperature is high, the temperature of the battery module 10 may rise due to not only chemical reactions during charging and discharging but also ambient temperature. Therefore, the central server 200 may more strictly apply the diagnosis code according to the temperature rise of the battery module 10 by changing the diagnosis condition in a high temperature section in consideration of the temperature rise of the battery module 10 according to the ambient temperature. For example, even if the temperature of the battery module 10 in winter and the temperature of the battery module 10 in summer are the same, a diagnosis code of a higher level may be generated for the battery module 10 in summer.

As another example, the central server 200 may transmit the second diagnosis table to the plurality of battery diagnosing apparatuses 100 at every predetermined cycle. For example, the central server 200 may transmit the second diagnosis table to the plurality of battery diagnosing apparatuses 100 at every month. If the diagnosis condition of the second diagnosis table is updated according to season change as in the former embodiment, in some of the plurality of battery diagnosing apparatuses 100, the first diagnosis table may be updated only by the seasonal change. Therefore, the central server 200 may maintain the state of the first diagnosis tables stored in the plurality of battery diagnosing apparatuses 100 as a latest state by not only updating the second diagnosis table but also transmitting the second diagnosis table to the plurality of battery diagnosing apparatuses 100 at every predetermined cycle.

As such, the battery diagnosing system according to an embodiment of the present disclosure may improve the accuracy of the state diagnosis for the battery module 10 by updating the first diagnosis table stored in the plurality of battery diagnosing apparatuses 100 to the second diagnosis table in which the latest content is reflected.

The central server 200 may be configured to store the battery state information and the diagnosis codes received from each of the plurality of battery diagnosing apparatuses 100.

Preferably, the central server 200 may serve as a backup server for storing the battery state information and the diagnosis codes for each of the plurality of battery diagnosing apparatuses 100. Therefore, even if the battery diagnosing apparatus 100 is damaged so that the battery state information and the diagnosis code stored in the main storage area 141 of the storage unit 140 are lost, the corresponding battery state information and the corresponding diagnosis code may be recovered through the central server 200.

In addition, the central server 200 may store the battery state information and the diagnosis codes for each of the plurality of battery diagnosing apparatuses 100 and provide the same to each user. Accordingly, the user may obtain the battery state information and the diagnosis code by accessing the central server 200 without accessing the main storage area 141 of the battery diagnosing apparatus 100 to obtain the battery state information and the diagnosis code. Therefore, there is an advantage in that the user may conveniently perform self-diagnosis for the battery module 10 by accessing the central server 200.

Also, preferably, the central server 200 may provide the user with information about a diagnosis state and a diagnosis measure for the stored diagnosis code. Therefore, the user may more conveniently self-diagnose the state of the battery module 10 and take a self-measure.

In addition, the central server 200 may be configured to store update history of the first diagnosis table stored in each of the plurality of battery diagnosing apparatuses 100.

Preferably, when transmitting the second diagnosis table to the plurality of battery diagnosing apparatuses 100, the central server 200 may selectively transmit the second diagnosis table only to the battery diagnosing apparatus 100 that stores a first diagnosis table different from the contents of the second diagnosis table at present. Accordingly, by preventing an overload of a communication channel to which the central server 200 and the plurality of battery diagnosing apparatuses 100 are connected, it is possible to transmit the second diagnosis table and update the first diagnosis table more quickly.

The battery diagnosing system according to another embodiment of the present disclosure has an advantage of storing the battery state information and the diagnosis code of the plurality of battery diagnosing apparatuses 100, preventing the battery state information and the diagnosis code from being lost due to damage to the battery diagnosing apparatus 100, and providing the contents of the battery state information and the diagnosis code to the user.

In addition, the battery diagnosing system has an advantage of preventing an overload of the communication channel so that the first diagnosis table is updated more quickly.

The central server may be configured to calculate a deviation of the battery state information for each battery cell included in the battery module, based on the battery state information.

For example, in the embodiment of FIG. 2, even if the state of each of the plurality of battery cells B1, B2 and B3 is diagnosed as a battery normal state based on the voltage or SOC, the voltages or SOCs of the plurality of battery cells B1, B2 and B3 may be different from each other.

That is, if the states of the plurality of battery cells B1, B2 and B3 provided in one battery module 10 are different from each other, the performance efficiency of the battery module 10 may be deteriorated, and an overcharge or overdischarge problem may occur. Therefore, the central server 200 may calculate a deviation of the battery state information of the plurality of battery cells B1, B2 and B3.

The central server 200 may be configured to diagnose the state of the battery module based on the calculated deviation.

Specifically, the central server 200 may calculate a voltage or SOC deviation of the plurality of battery cells B1, B2 and B3.

For example, if the SOC of the third battery cell B3 is lower than the SOCs of the first battery cell B1 and the second battery cell B2, the central server 200 may diagnose that the state of the battery module 10 is a state where balancing is required (or, a balancing-required state). Preferably, the central server 200 may diagnose the state of the battery module 10 as a balancing-required state if the SOCs of the plurality of battery cells B1, B2 and B3 provided in the battery module 10 are different from each other by 4% or more.

That is, the central server 200 may diagnose the state of each of the plurality of battery cells B1, B2 and B3 and diagnose the deviation among the plurality of battery cells B1, B2 and B3, based on the battery state information received from the battery diagnosing apparatus 100. Accordingly, the central server 200 may generate a comprehensive diagnosis result for the battery module 10 including the plurality of battery cells B1, B2 and B3.

In addition, the central server 200 may be configured to transmit a diagnosis result to the battery diagnosing apparatus.

As in the former embodiment, if the state of the battery module 10 is diagnosed as a balancing-required state, the central server 200 may transmit the diagnosis result to the battery diagnosing apparatus 100. In addition, preferably, the battery diagnosing apparatus 100 may be configured to receive the diagnosis result and perform balancing for each of the plurality of battery cells B1, B2 and B3 provided in the battery module 10 according to the received diagnosis result.

That is, the battery diagnosing apparatus 100 may reduce the voltage or SOC deviation of the plurality of battery cells B1, B2, and B3 by balancing the battery module 10 according to the received diagnosis result, thereby improving the performance efficiency of the battery module 10. In addition, by performing balancing, the battery diagnosing apparatus 100 may prevent an overdischarge or overcharge problem that may occur in the plurality of battery cells B1, B2 and B3.

Therefore, the battery diagnosing system according to an embodiment of the present disclosure has an advantage of improving reliability by more accurately diagnosing the state of the battery module 10 through the primary state diagnosis by the battery diagnosing apparatus and the secondary state diagnosis by the central server.

Figure 7:
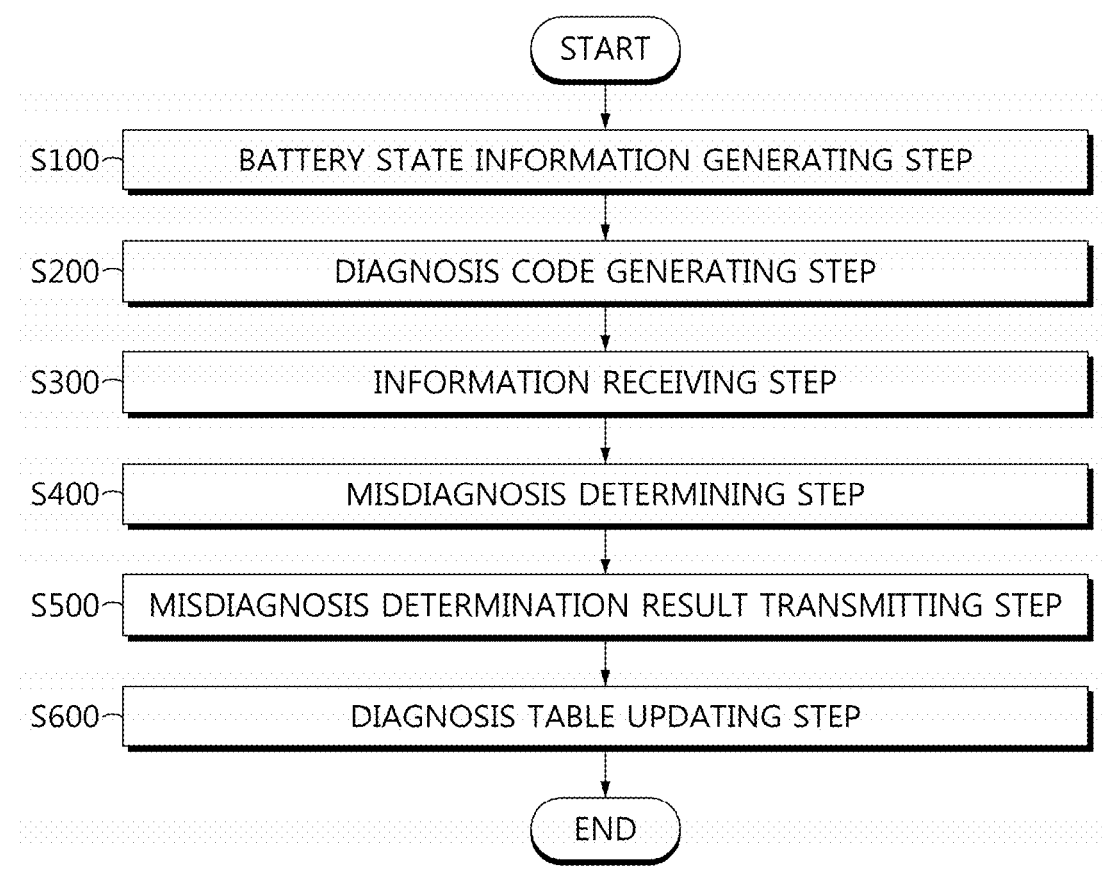
FIG. 7 is a diagram showing a battery diagnosing method according to still another embodiment of the present disclosure.

FIG. 7 is a diagram showing a battery diagnosing method according to still another embodiment of the present disclosure. The battery diagnosing method may be performed by the battery diagnosing system. Specifically, each step of the battery diagnosing method may be performed by the battery diagnosing apparatus 100 or the central server 200.

Referring to FIG. 7, a battery diagnosing method according to still another embodiment of the present disclosure may include a battery state information generating step (S100), a diagnosis code generating step (S200), an information receiving step (S300), a misdiagnosis determining step (S400), a misdiagnosis determination result transmitting step (S500) and a diagnosis table updating step (S600).

The battery state information generating step (S100) is a step of generating battery state information based on at least one of temperature, voltage and current of the battery module 10, and may be performed by the battery diagnosing apparatus 100. Specifically, the battery state information generating step (S100) may be performed by the control unit 130 of the battery diagnosing apparatus 100.

First, before the battery state information is generated, the measuring unit 120 of the battery diagnosing apparatus 100 may measure the temperature, voltage and current of the connected battery module 10.

In addition, the control unit 130 may generate battery state information such as temperature information, voltage information, current information and SOC information based on the temperature, voltage and current of the battery module 10 measured by the measuring unit 120.

The diagnosis code generating step (S200) is a step of generating a diagnosis code for the battery state information by using a pre-stored first diagnosis table, and may be performed by the battery diagnosing apparatus 100. Specifically, the diagnosis code generating step (S200) may be performed by the control unit 130 of the battery diagnosing apparatus 100.

The control unit 130 may generate the diagnosis code according to the battery state information by putting the generated battery state information into the first diagnosis table stored in the first storage area 142 of the storage unit 140 and then reading a corresponding diagnosis code.

The information receiving step (S300) is a step of receiving at least one of the battery state information and the diagnosis code from the battery diagnosing apparatus 100, and may be performed by the central server 200.

The battery diagnosing apparatus 100 and the central server 200 may be connected through a wireless communication channel. Accordingly, the battery diagnosing apparatus 100 may transmit the generated battery state information and the generated diagnosis code to the central server 200, and the central server 200 may receive the battery state information and the diagnosis code from the battery diagnosing apparatus 100.

The misdiagnosis determining step (S400) is a step of determining whether the received diagnosis code is misdiagnosed by using the stored second diagnosis table and the received battery state information, and may be performed by the central server 200.

The central server 200 may store the second diagnosis table. The central server 200 may compare the result obtained by putting the battery state information received from the battery diagnosing apparatus 100 into the second diagnosis table with the diagnosis code received from the battery diagnosing apparatus 100 to determine whether they are identical to each other.

If the result obtained through the second diagnosis table and the received diagnosis code are identical, the central server 200 may determine that the battery state information is accurately diagnosed by the battery diagnosing apparatus 100. If the result obtained through the second diagnosis table and the received diagnosis code are different, the central server 200 may determine that the battery state information is incorrectly diagnosed by the battery diagnosing apparatus 100.

The misdiagnosis determination result transmitting step (S500) is a step of transmitting a misdiagnosis determination result and the second diagnosis table to the battery diagnosing apparatus 100 if it is determined that the diagnosis code is misdiagnosed, and may be performed by the central server 200.

That is, the misdiagnosis determination result transmitting step (S500) may be performed only when the central server 200 determines that the diagnosis code of the battery diagnosing apparatus 100 is misdiagnosed in the misdiagnosis determination step.

The central server 200 may transmit the misdiagnosis determination result and the second diagnosis table to the battery diagnosing apparatus 100. Here, the misdiagnosis determination result may be a result obtained by comparing the result obtained through the second diagnosis table with the diagnosis code received from the battery diagnosing apparatus 100.

The diagnosis table updating step (S600) is a step of updating the pre-stored first diagnosis table to the second diagnosis table if the misdiagnosis determination result and the second diagnosis table are received from the central server 200, and may be performed by the battery diagnosing apparatus 100.

The battery diagnosing apparatus 100 may receive and store the misdiagnosis determination result, and may update the first diagnosis table by receiving the second diagnosis table. In this case, the battery diagnosing apparatus 100 may receive and store the second diagnosis table in an area different from the area in which the first diagnosis table is stored. In addition, if the second diagnosis table is completely stored, the battery diagnosing apparatus 100 may update the first diagnosis table to the second diagnosis table. At this time, the battery diagnosing apparatus 100 may update the first diagnosis table by overwriting the second diagnosis table on the first diagnosis table, or by changing the first reference address indicating the area where the first diagnosis table is stored and the second reference address indicating the area where the second diagnosis table is stored with each other.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
10: battery module
100: battery diagnosing apparatus
100a to 100c: first to third battery diagnosing apparatuses
110: communication unit
120: measuring unit
121: temperature measuring unit
122: voltage measuring unit
123: current measuring unit
130: control unit
140: storage unit
141: main storage area
142: first storage area
143: second storage area
200: central server
B1 to B3: first to third battery cells
A: ampere meter
SL1 to SL6: first to sixth sensing lines

What is claimed is:

1. A battery diagnosing system for diagnosing a state of a battery module having at least one battery cell, the battery diagnosing system comprising:
   a battery diagnosing apparatus configured to:
      generate battery state information, based on at least one of temperature, voltage, and current of the battery module;
      generate a diagnosis code corresponding to the battery state information by using a pre-stored first diagnosis table; and
      transmit at least one of the battery state information and the diagnosis code; and
   a central server configured to:
      receive at least one of the battery state information and the diagnosis code from the battery diagnosing apparatus;
      determine whether the received diagnosis code is misdiagnosed by using a stored second diagnosis table and the received battery state information; and
      transmit a misdiagnosis determination result and the second diagnosis table to the battery diagnosing apparatus when the diagnosis code is determined as being misdiagnosed,
   wherein the battery diagnosing apparatus is further configured to update the pre-stored first diagnosis table to the second diagnosis table when the misdiagnosis determination result and the second diagnosis table are received from the central server.

2. The battery diagnosing system according to claim 1, wherein the central server is further configured to determine whether the received diagnosis code is misdiagnosed by comparing a result obtained by putting the battery state information into the second diagnosis table with the received diagnosis code.

3. The battery diagnosing system according to claim 1, wherein the battery diagnosing apparatus is further configured to:
   store the second diagnosis table received from the central server in an area different from the area in which the first diagnosis table is stored; and
   change the first diagnosis table to the second diagnosis table when the second diagnosis table is completely stored.

4. The battery diagnosing system according to claim 3, wherein the battery diagnosing apparatus is further configured to:
   store the first diagnosis table in an area indicated by a first reference address; and
   change the first reference address and a second reference address with each other when the second diagnosis table is stored in an area indicated by the second reference address.

5. The battery diagnosing system according to claim 1, wherein:
   the central server is connected to a plurality of battery diagnosing apparatuses; and
   the central server is further configured to transmit the misdiagnosis determination result and the second diagnosis table to a battery diagnosing apparatus that has transmitted the misdiagnosed diagnosis code among the plurality of battery diagnosing apparatuses.

6. The battery diagnosing system according to claim 5, wherein, when the second diagnosis table is updated, the central server is further configured to transmit the updated second diagnosis table to all of the plurality of battery diagnosing apparatuses, based on an updated content or a predetermined cycle.

7. The battery diagnosing system according to claim 5, wherein the central server is further configured to:
   store the battery state information and the diagnosis code received from each of the plurality of battery diagnosing apparatuses; and
   store an update history of the stored first diagnosis table in each of the plurality of battery diagnosing apparatuses.

8. The battery diagnosing system according to claim 1, wherein the central server is further configured to:
   calculate a deviation of the battery state information for each battery cell included in the battery module,. based on the battery state information;

diagnose a state of the battery module, based on the calculated deviation; and transmit the diagnosis result to the battery diagnosing apparatus.

9. The battery diagnosing system according to claim 8, wherein the battery diagnosing apparatus is further configured to:

receive the diagnosis result; and perform balancing to each battery cell included in the battery module according to the received diagnosis result.

10. A battery diagnosing method, comprising:

a battery state information generating operation of, by a battery diagnosing apparatus, generating battery state information, based on at least one of temperature, voltage, and current of a battery module;

a diagnosis code generating operation of, by the battery diagnosing apparatus, generating a diagnosis code corresponding to the battery state information by using a pre-stored first diagnosis table;

an information receiving operation of, by a central server, receiving at least one of the battery state information and the diagnosis code from the battery diagnosing apparatus;

a misdiagnosis determining operation of, by the central server, determining whether the received diagnosis code is misdiagnosed by using a stored second diagnosis table and the received battery state information;

a misdiagnosis determination result transmitting operation of, by the central server, transmitting a misdiagnosis determination result and the second diagnosis table to the battery diagnosing apparatus when the diagnosis code is determined as being misdiagnosed; and a diagnosis table updating operation of, by the battery diagnosing apparatus, updating the pre-stored first diagnosis table to the second diagnosis table when the misdiagnosis determination result and the second diagnosis table are received from the central server.

* * * * *